(12) United States Patent
Ko et al.

(10) Patent No.: US 10,325,924 B2
(45) Date of Patent: *Jun. 18, 2019

(54) SEMICONDUCTOR DEVICE AND METHOD OF FABRICATING THE SAME

(71) Applicant: SK hynix Inc., Gyeonggi-do (KR)

(72) Inventors: Min Sung Ko, Chungcheongbuk-do (KR); Sung Soon Kim, Seoul (KR); Wan Sup Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/980,382

(22) Filed: May 15, 2018

(65) Prior Publication Data

US 2018/0301466 A1 Oct. 18, 2018

Related U.S. Application Data

(63) Continuation of application No. 14/731,115, filed on Jun. 4, 2015, now Pat. No. 9,997,532.

(30) Foreign Application Priority Data

Jan. 13, 2015 (KR) ........................ 10-2015-0006343

(51) Int. Cl.
*H01L 21/764* (2006.01)
*H01L 27/11582* (2017.01)

(52) U.S. Cl.
CPC ...... *H01L 27/11582* (2013.01); *H01L 21/764* (2013.01)

(58) Field of Classification Search
CPC ........... H01L 27/1157; H01L 27/11582; H01L 29/788; H01L 21/336; H01L 27/0689; H01L 27/1052; H01L 27/1151; H01L 29/0649; H01L 21/76264; H01L 2221/1042; H01L 2221/1047; H01L 21/76289; H01L 21/764; H01L 21/7682; H01L 23/4821; H01L 29/4991
See application file for complete search history.

(56) References Cited

U.S. PATENT DOCUMENTS

| | | | |
|---|---|---|---|
| 8,525,247 B2 * | 9/2013 | Park | H01L 27/2409 257/314 |
| 2010/0148237 A1 * | 6/2010 | Kito | H01L 27/11551 257/315 |
| 2012/0008400 A1 * | 1/2012 | Fukuzumi | G11C 16/0483 365/185.18 |
| 2012/0028454 A1 * | 2/2012 | Swaminathan | C23C 16/045 438/558 |
| 2013/0234233 A1 * | 9/2013 | Fujiwara | H01L 29/792 257/324 |
| 2015/0060977 A1 * | 3/2015 | Lee | H01L 29/7926 257/314 |

(Continued)

*Primary Examiner* — Mark W Tornow
*Assistant Examiner* — Priya M Rampersaud
(74) *Attorney, Agent, or Firm* — IP & T Group LLP

(57) ABSTRACT

A semiconductor device includes a stacked structure, openings passing through stacked structure, semiconductor patterns formed over inner walls of the openings, liner layers formed in the openings over the semiconductor patterns, and gap-fill insulating layers formed over the liner layers to fill the openings, wherein each of the gap-fill insulating layers seals an upper portion of the opening and includes at least one air gap.

16 Claims, 8 Drawing Sheets

(56) References Cited

U.S. PATENT DOCUMENTS

2015/0236028 A1* 8/2015 Oh .................... H01L 27/11517
   257/316
2015/0303214 A1* 10/2015 Kim ................. H01L 27/11582
   257/329

* cited by examiner

SEMICONDUCTOR DEVICE AND METHOD OF FABRICATING THE SAME

CROSS-REFERENCE TO RELATED APPLICATION

This application is a continuation of U.S. patent application Ser. No. 14/731,115 filed on Jun. 4, 2015, which claims priority to Korean patent application number 10-2015-0006343, filed on Jan. 13, 2015. The disclosure of each of the foregoing applications is herein incorporated by reference in its entirety.

BACKGROUND

Field of Invention

Various exemplary embodiments relate generally to an electronic device and a method of fabricating the same and, more particularly, to a semiconductor device having a three-dimensional structure and a method of fabricating the same.

Description of Related Art

Non-volatile memory devices retain stored data with or without a power supply. Two-dimensional memory devices having memory cells fabricated in a single layer over a silicon substrate have reached their limit when it comes to increasing their degree of integration. Accordingly, three-dimensional non-volatile memory devices having memory cells stacked in a vertical direction over a silicon substrate have been proposed.

In a three-dimensional non-volatile memory device, gate electrodes and insulating layers are stacked alternately with each other, and vertical channel layers are formed therethrough, so that memory cells and selection transistors are stacked. However, since a plurality of vertical channel layers are formed at the same time, manufacturing processes are complicated and manufacturing costs are increased. In addition, the memory cells and the selection transistors may have non-uniform characteristics. More specifically, the selection transistors may have a wide threshold voltage distribution.

SUMMARY

An embodiment is directed to a semiconductor device including transistors having uniform characteristics and a method of fabricating the same.

A semiconductor device according to an embodiment may include a stacked structure, openings passing through stacked structure, semiconductor patterns formed over inner walls of the openings, liner layers formed in the openings over the semiconductor patterns, and gap-fill insulating layers formed over the liner layers to fill the openings, wherein each of the gap-fill insulating layers seals an upper portion of the opening and includes at least one air gap.

A method of fabricating a semiconductor device according to an embodiment may include forming a stacked structure, forming openings by passing through the stacked structure, forming semiconductor patterns over an inner wall of the openings, and forming insulating patterns over the semiconductor patterns to fill the openings, wherein each of the insulating patterns seals an upper portion of the opening and includes at least one air gap.

A semiconductor device according to an embodiment may include a stacked structure, openings passing through stacked structure, semiconductor patterns formed over inner walls of the openings, and insulating patterns formed over the semiconductor patterns to fill the openings, wherein each of the insulating patterns seals an upper portion of the opening and includes at least one air gap.

DETAILED DESCRIPTION

Figure 1A:
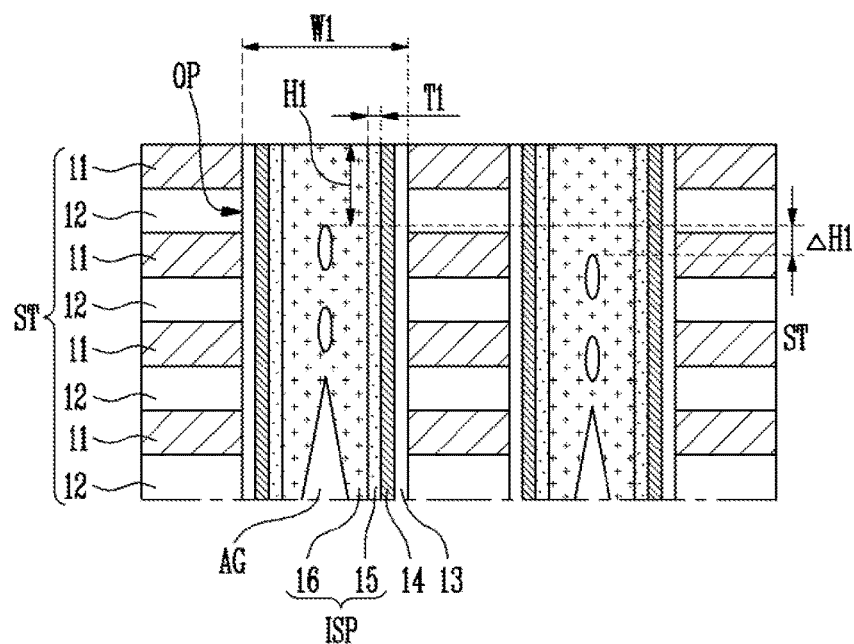
FIGS. 1A and 1B are cross-sectional views of the structure of a semiconductor device according to an embodiment.

Hereinafter, various exemplary embodiments of the present invention will be described in detail with reference to the accompanying drawings. In the drawings, thicknesses and lengths of components are exaggerated for convenience. In the following description, a detailed explanation of known related functions and constitutions may be omitted to avoid unnecessarily obscuring the subject manner. Like reference numerals refer to like elements throughout the specification and drawings.

Figure 1B:
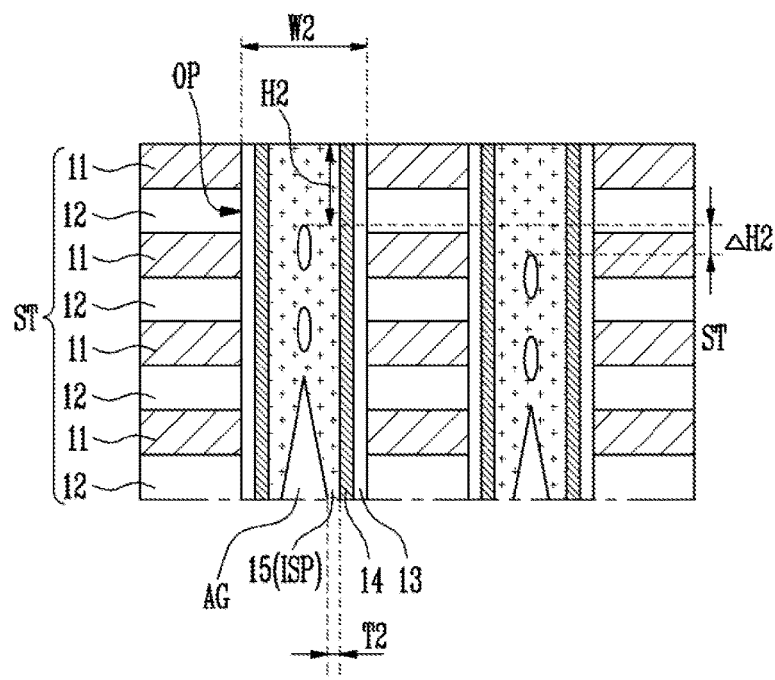

FIGS. 1A and 1B are cross-sectional views of the structure of a semiconductor device according to an embodiment.

Referring to FIGS. 1A and 1B, the semiconductor device according to the embodiment may include a stacked structure ST, at least one opening OP, at least one semiconductor pattern 14 and at least one insulating pattern ISP.

The stacked structure ST may include an insulating material, or first material layers 11 and second material layers 12 stacked alternately with each other. For example, the first material layers 11 may be gate electrodes, such as a gate of a selection transistor and a gate of a memory cell, and include a conductive material. The second material layers 12 may be insulating layers which insulate the stacked gate electrodes and include oxide or nitride. In another example, the first material layers 11 may be channel layers such as a channel layer of a selection transistor and a channel layer of a memory cell, and include a semiconductor material such as silicon (Si) or germanium (Ge). The second material layers 12 may be insulating layers which insulate the stacked channel layers and include oxide or nitride.

At least one opening OP may pass through the stacked structure ST. The opening OP may have various geometrical shapes such as circular, elliptical, rectangular, polygonal and linear cross-sections. In addition, the opening OP may have upper and lower portions whose widths are substantially equal to each other. In other words, the upper and lower portions of the opening OP may have substantially the same width as each other in a range allowing for process error. However, the opening OP may have a width decreasing from the upper portion to the lower portion, or may be uneven on an inner wall thereof.

At least one semiconductor pattern 14 may be formed in at least one opening OP and formed on the inner wall of the opening OP. The semiconductor pattern 14 may have a predetermined thickness not to completely fill the opening OP and include silicon (Si) or germanium (Ge). A dielectric layer 13 may be further formed in the opening OP to surround an outer wall of the semiconductor pattern 14. For example, the semiconductor pattern 14 may be a channel layer, and the dielectric layer 13 may be a memory layer. The memory layer may include at least one of a tunnel insulating layer, a data storage layer and a charge blocking layer. The data storage layer may include silicon, nitride, nanodots, or a phase-change material. In addition, although the embodiment shows that the dielectric layer 13 surrounds the outer wall of the semiconductor pattern 14, the dielectric layer 13 may have a C shape to surround each of the first material layers 11, or a combination thereof.

The insulating pattern ISP may be formed on the semiconductor pattern 14 to fill the opening OP. In addition, the insulating pattern ISP may seal the upper portion of the opening OP and include at least one air gap AG. The insulating pattern ISP may include a single layer or a plurality of layers, depending on a width W1 and a width W2 of the opening OP. For example, when the width W1 of the opening OP is large, the insulating pattern ISP may include a plurality of layers. When the width W2 of the opening OP is small, the insulating pattern ISP may include a single layer.

FIG. 1A illustrates that the width W1 of the opening OP is relatively large. The insulating pattern ISP may include a liner layer 15 and a gap-fill insulating layer 16. The liner layer may be formed on the semiconductor pattern 14 with a uniform thickness T1 so that the liner layer 15 may not completely fill the opening OP. The gap-fill insulating layer 16 may be formed on the liner layer 15 to fill the opening OP and be thick enough to seal the upper portion of the opening OP. The gap-fill insulating layer 16 may have a thickness increasing from the lower portion to the upper portion of the opening OP.

The liner layer 15 or the gap-fill insulating layer 16 may include at least one air gap AG. For example, the gap-fill insulating layer 16 may not be formed in the lower portion of the opening OP. In this case, the air gap AG may be formed in the lower portion of the opening OP, and the liner layer 15 may be exposed by the air gap AG. However, the semiconductor pattern 14 covered by the liner layer 15 may not be exposed.

The upper portion of the opening OP may be completely sealed by the gap-fill insulating layer 16 so that the air gap AG does not exist. When a plurality of openings OP exist, the openings OP may be sealed at different heights H1. In addition, the gap-fill insulating layers 16 may include the air gaps AG having different heights. For example, a height difference ΔH1 may exist between a first air gap AG included in a first gap-fill insulating layer 16 and a second air gap AG included in a second gap-fill insulating layer 16.

When the upper portion of the opening OP is sealed by the gap-fill insulating layer 16, impurities included in the gap-fill insulating layer 16 may be prevented from moving to the semiconductor pattern 14 by the liner layer 15. In addition, since the semiconductor pattern 14 is not exposed, agglomeration of the semiconductor pattern 14 may be prevented during manufacturing processes. Therefore, curing or heat treatment to prevent agglomeration of the semiconductor pattern 14 may be omitted.

FIG. 1B illustrates that the width W2 of the opening OP is relatively small. The insulating pattern ISP may include the liner layer 15 formed on the semiconductor pattern 14 to fill the opening OP and sealing the upper portion of the opening OP. The liner layer 15 may have a thickness T2 which increases from the lower portion to the upper portion of the opening OP, and include at least one air gap AG.

When a plurality of openings OP exist, the openings OP may be sealed at different heights H2. In addition, the air gaps AG included in the liner layers 15 may have different heights. For example, a height difference ΔH2 may exist between the first air gap AG included in the first liner layer 15 and the second air gap AG included in the second liner layer 15.

When the liner layer 15 is formed on the semiconductor pattern 14 to fill the opening OP and seals the upper portion of the opening OP, a process of forming a gap-fill insulating layer may be skipped to thereby simplify manufacturing processes. In addition, since the semiconductor pattern 14 is not exposed, agglomeration of the semiconductor pattern 14 may be prevented during manufacturing processes. Therefore, curing or heat treatment to prevent agglomeration of the semiconductor pattern 14 may be omitted.

In another embodiment, a semiconductor device may include a conductive pattern instead of the semiconductor pattern 14. In this example, the conductive pattern may include polysilicon, tungsten, copper, titanium, tantalum, titanium nitride, tantalum nitride, or the like.

Figure 2A:
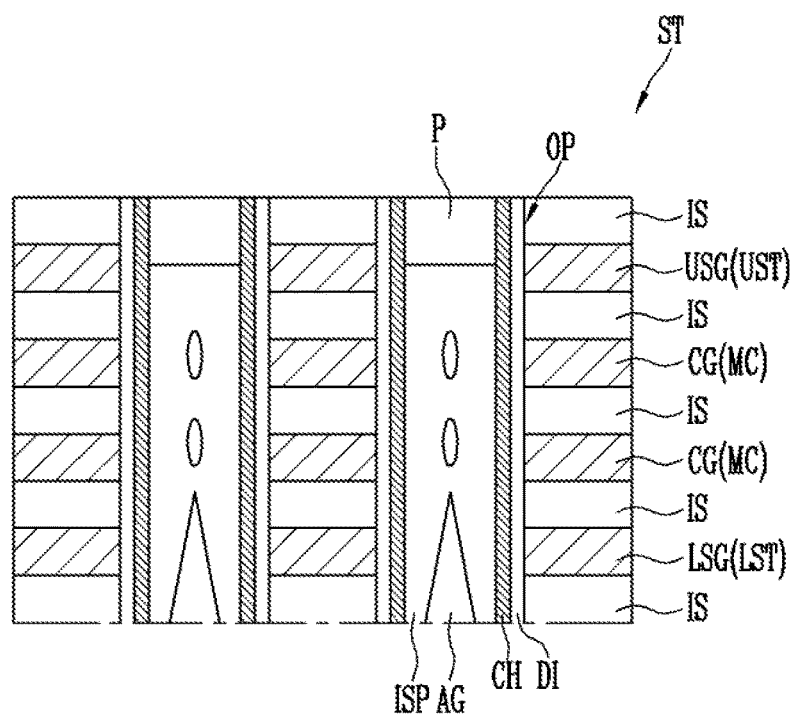
FIGS. 2A and 2B are cross-sectional views of a memory string of a semiconductor device according to an embodiment.
Figure 2B:
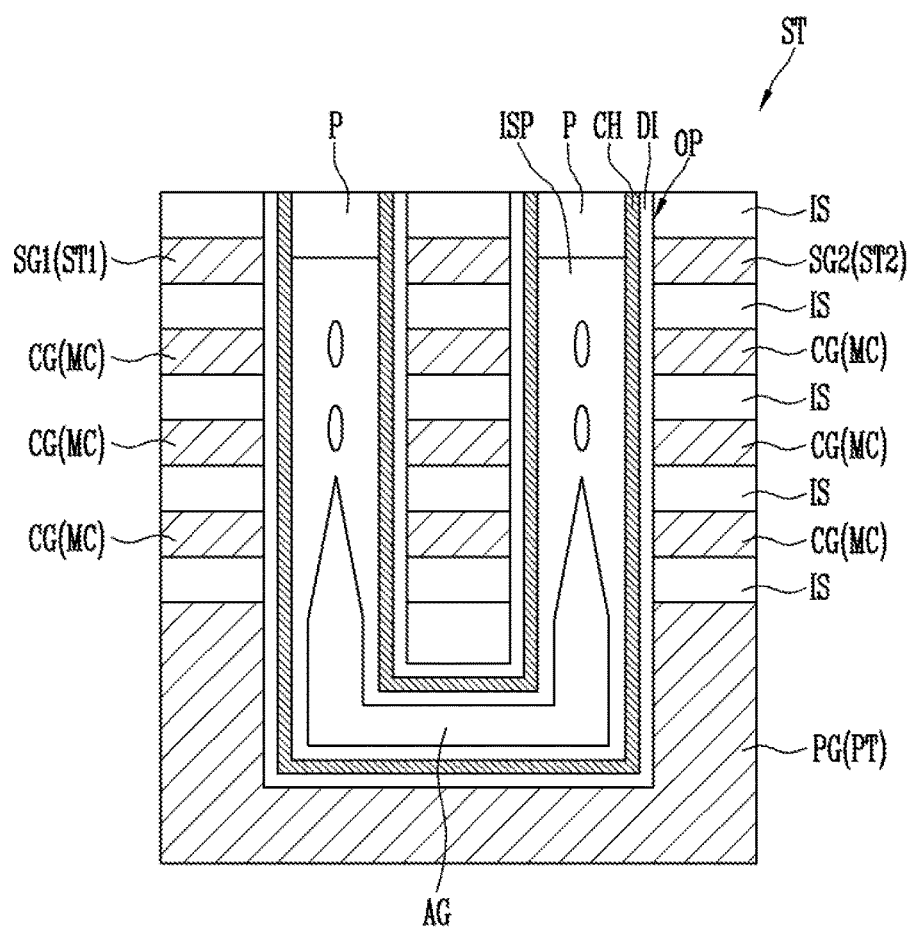

FIGS. 2A and 2B are cross-sectional views illustrating a memory string of a semiconductor device according to an embodiment.

Referring to FIG. 2A, a stacked structure ST may include at least one lower selection gate electrode LSG, a plurality of control gate electrodes CG and at least one upper selection gate electrode USG which are stacked in a sequential manner, and include insulating layers IS interposed therebetween. In the above-described stacked structure ST, at least one lower selection transistor LST, a plurality of memory cells MC and at least one upper selection transistor UST may be coupled in series to form a single memory string.

At least one opening OP may pass through the stacked structure ST. A dielectric layer DI, a channel layer CH, an insulating pattern ISP, an air gap AG and a conductive plug P may be formed in the opening OP. The channel layer CH may be straight, and the insulating pattern ISP may have the shape described above with reference to FIGS. 1A and 1B. The air gap AG may be located in the insulating pattern ISP and be positioned at a level lower than the upper selection gate electrode USG. The conductive plug P may be formed in the opening OP on the insulating pattern ISP to cap an entry of the opening OP and partially overlap with the upper selection gate electrode USG. For example, a lower surface of the conductive plug P may be located between an upper surface and a lower surface of the upper selection gate electrode USG.

In addition, the plurality of conductive plugs P formed in the plurality of openings OP may have a uniform height. The plurality of conductive plugs P may include junctions of the upper selection transistors UST at regions overlapping with the upper selection gate electrodes USG. Therefore, the junctions may also be located at a uniform height. As a result, the upper selection transistors UST may have uniform threshold voltage characteristics.

Referring to FIG. 2B, a stacked structure ST may include a pipe gate electrode PG, control gate electrodes CG and one or more selection gate electrodes SG1 and SG2 which are stacked in a sequential manner, and include insulating layers IS interposed therebetween. In the above-described stacked structure ST, at least one first selection transistor ST1, a plurality of memory cells MC, a pipe transistor PT, a plurality of memory cells MC and at least one second selection transistor ST2 may be coupled in series to form a single memory string.

An opening OP may pass through the stacked structure ST and have a U shape. A dielectric layer DI, a channel layer CH, an insulating pattern ISP, an air gap AG and conductive plugs P may be located in the opening OP. The channel layer CH may have a U shape. For example, the channel layer CH may include at least two vertical patterns passing through the stacked structure ST in a vertical direction and a coupling pattern coupling the vertical patterns. The insulating pattern ISP may include a first air gap formed in the coupling pattern and at least one second air gap formed in the vertical patterns. In addition, the first air gap may extend to lower portions of the vertical patterns. The air gap AG may be positioned at a level lower than the first and second selection gate electrodes SG1 and SG2. The conductive plugs P may be formed in the opening OP on the insulating pattern ISP to cap an entry of the opening OP. A lower surface of the conductive plug P may be located between upper and lower surfaces of the first and second selection gate electrodes SG1 and SG2.

In addition, the conductive plugs P may have a uniform height. Therefore, junctions of the first and second selection transistors ST1 and ST2 may be located at a uniform height, so that the first and second selection transistors ST1 and ST2 may have uniform threshold voltage characteristics.

FIGS. 3A to 3D are cross-sectional views illustrating a method of fabricating a semiconductor device according to an embodiment.

Figure 3A:
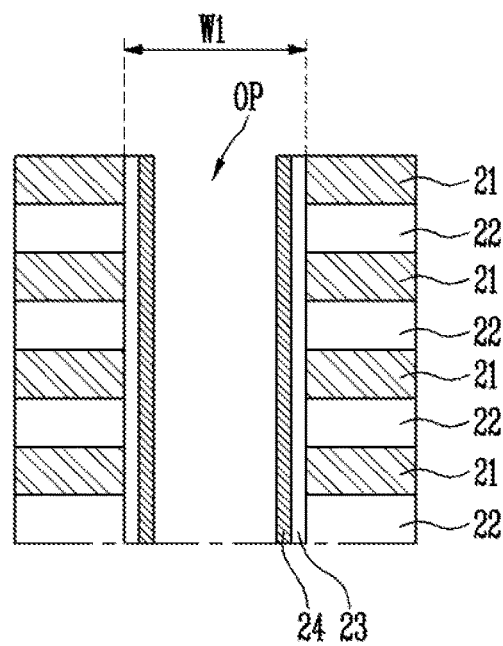
FIGS. 3A to 3D are cross-sectional views illustrating a method of fabricating a semiconductor device according to an embodiment.

Referring to FIG. 3A, first material layers 21 and second material layers 22 may be stacked alternately with each other to form a stacked structure. The first material layers 21 may include a material having an etch selectivity to the second material layers 22. For example, the first material layers 21 may be sacrificial layers including nitride, and the second material layers 22 may be insulating layers including oxide. In another example, the first material layers 21 may be conductive layers including doped polysilicon, doped amorphous silicon, or the like, and the second material layers 22 may be sacrificial layers including undoped polysilicon, undoped amorphous silicon, or the like. In another example, the first material layers 21 may be conductive layers including doped polysilicon or doped amorphous silicon, and the second material layers 22 may be insulating layers including oxide. According to an embodiment, a description is made in reference to an example in which the first material layers 21 include sacrificial layers and the second material layers 22 include insulating layers.

Subsequently, the opening OP may be formed by passing through the first and second material layers 21 and 22. The opening OP may have a relatively large width W1. The opening OP may have various geometrical shapes such as circular, elliptical, rectangular, polygonal and linear cross-sections.

A dielectric layer 23 and a semiconductor pattern 24 may be formed on an inner wall of the opening OP not to completely fill the opening OP. The dielectric layer 23 may include at least one of a charge blocking layer, a data storage layer and a tunnel insulating layer. The data storage layer may include silicon, nitride, a phase-change material or nanodots. In addition, the semiconductor pattern 24 may include silicon (Si), germanium (Ge) or the like.

Figure 3B:
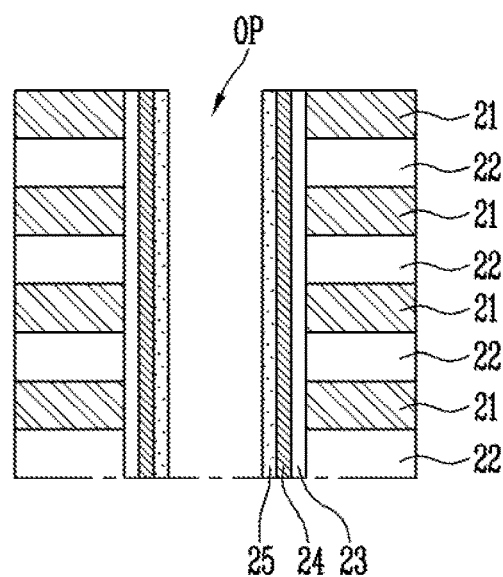
Figure 3C:
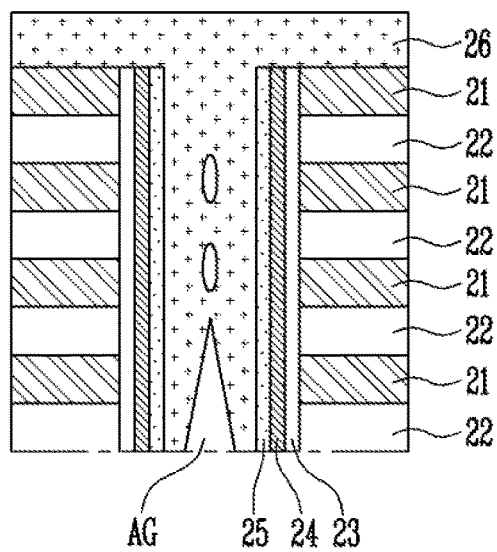

Referring to FIGS. 3B and 3C, after a liner layer 25 is formed on the semiconductor pattern 24 not to completely fill the opening OP, a gap-fill insulating layer 26 may be formed on the liner layer 25 to fill the opening OP and seal an upper portion of the opening OP. The liner layer 25 may have a predetermined thickness by which the liner layer 25 may not completely fill the opening OP. The gap-fill insulating layer 26 may be thick enough to completely fill the upper portion of the opening OP. The gap-fill insulating layer 26 may also be formed on an upper surface of the stacked structure.

The liner layer 25 may be formed by a deposition method to have better step coverage than the gap-fill insulating layer 26. In addition, the gap-fill insulating layer 26 may be formed at a higher deposition rate than the liner layer 25. As a result, the liner layer 25 may be formed on the semiconductor pattern 24 with a uniform thickness. In addition, the gap-fill insulating layer 26 may completely seal the upper portion of the opening OP without the air gap AG and include the air gap AG located in a lower portion of the opening OP.

For example, the liner layer 25 may be formed by an Atomic Layer Deposition (ALD) method or a Chemical Vapor Deposition (CVD) method, and the gap-fill insulating layer 26 may be formed by an Atomic Layer Deposition (ALD) method, a Chemical Vapor Deposition (CVD) method, or a High Aspect Ratio Process (HARP) method.

Figure 3D:
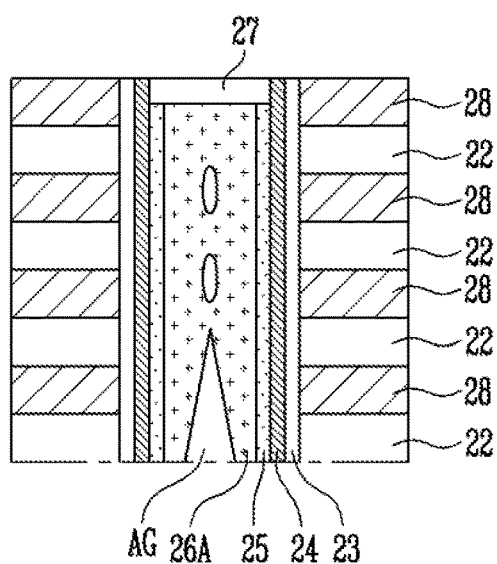

Referring to FIG. 3D, a gap-fill insulating pattern 26A may be formed by etching the gap-fill insulating layer 26 until an upper portion of the semiconductor pattern 24 is exposed. As a result, the opening OP may have a re-opened area, and a conductive plug 27 may be formed in the re-opened area of the opening OP. Since the upper portion of the opening OP is completely sealed by the gap-fill insulating layer 26 without the air gap AG, even when the gap-fill insulating layers 26 formed in the plurality of openings OP are etched at the same time, the gap-fill insulating layers 26 may be etched to a uniform depth. Therefore, the conductive plugs 27 may have a uniform height.

After a slit (not illustrated) is formed by etching the first and second material layers 21 and 22, the first material layers 21 may be removed using the slit. Subsequently, conductive layers 28 may be formed in regions from which the first material layers 21 are removed. Before the conductive layers 28 are formed, dielectric layers (not illustrated) may be further formed in the regions from which the first material layers 21 are removed. Thus, the dielectric layers may surround the conductive layers 28, respectively, in a "C" shape.

However, the above-described manufacturing processes may be changed depending on materials of the first and second material layers 21 and 22. For example, when the first material layers 21 include conductive layers and the second material layers 22 include sacrificial layers, insulating layers may be formed after the second material layers 22 are removed using the slit. In addition, when the first material layers 21 include conductive layers and the second material layers 22 include insulating layers, the first material layers 21 may be silicided using the slit.

Figure 4A:
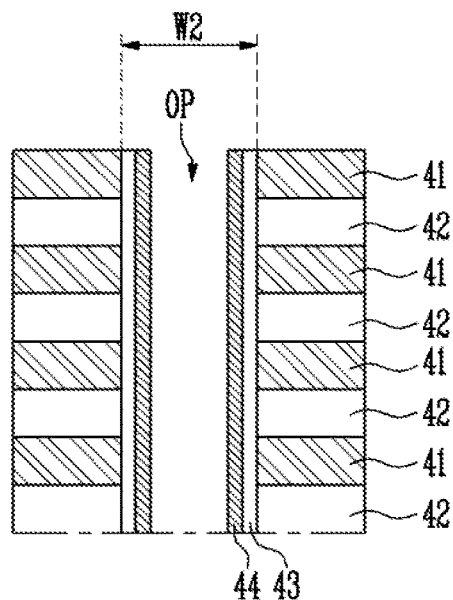
FIGS. 4A and 4B are cross-sectional views illustrating a method of fabricating a semiconductor device according to an embodiment.
Figure 4B:
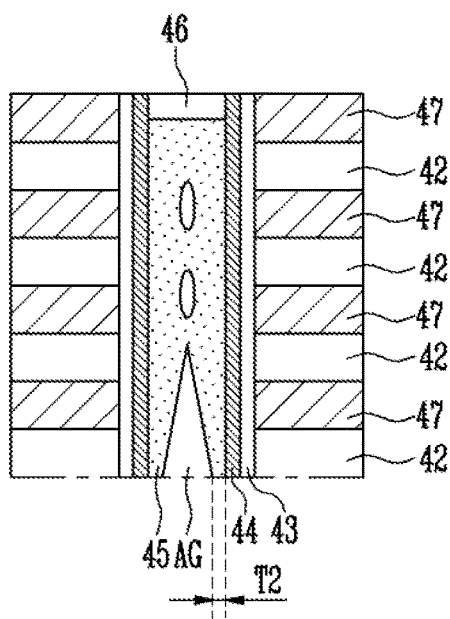

FIGS. 4A and 4B are cross-sectional views illustrating a method of fabricating a semiconductor device according to an embodiment. Repetitive descriptions of structures described above will be omitted.

Referring to FIG. 4A, after first and second material layers 41 and 42 are formed, the opening OP may be formed by passing through the first and second material layers 41 and 42. The opening OP may have a relatively small width W2. Subsequently, a dielectric layer 43 and a semiconductor pattern 44 may be formed on an inner wall of the opening OP not to completely fill the opening OP.

Referring to FIG. 4B, a liner layer 45 may be formed on the semiconductor pattern 44 to fill the opening OP. The liner layer 45 may be formed on the semiconductor patterns 44 to seal an upper portion of the opening OP. The liner layer 45 may be partially etched to re-open the upper portion of the opening OP, and a conductive plug 46 may be formed to fill the re-opened area of the opening OP.

Subsequently, a slit (not illustrated) may be formed by etching the first and second material layers 41 and 42. The first material layers 41 may be replaced by conductive layers 47 using the slit.

According to the embodiment, since the opening OP has the relatively small width W2, the upper portion of the opening OP may be sealed only by the liner layer 45. Therefore, a process of forming a gap-fill insulating layer may be skipped.

Figure 5:
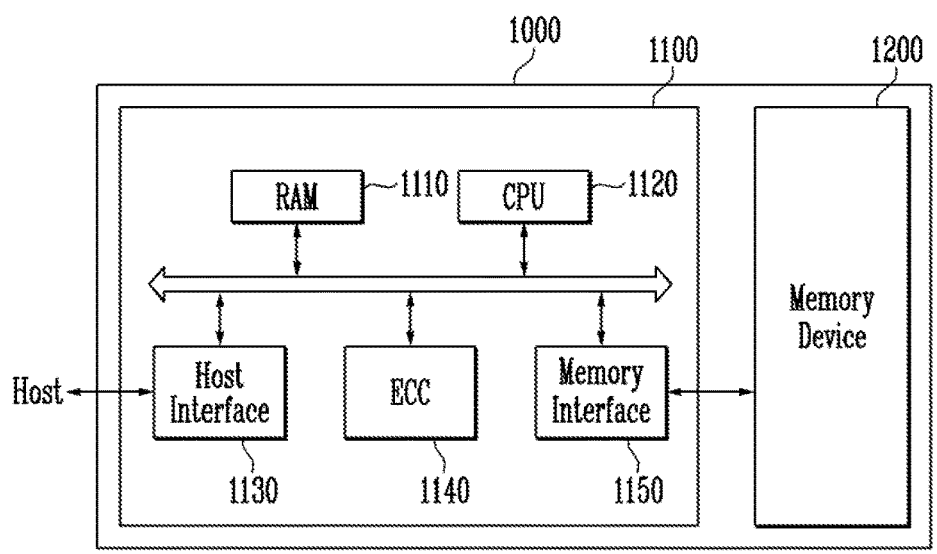
FIGS. 5 and 6 are block diagrams illustrating a memory system according to an embodiment.

FIG. 5 is a block diagram illustrating a memory system according to an embodiment.

As illustrated in FIG. 5, the memory system 1000 according to the embodiment may include a memory device 1200 and a controller 1100.

The memory device 1200 may be used to store various types of data such as text, graphic, and software code.

The memory device 1200 may be a non-volatile memory and include the structure described above and shown in FIGS. 1A to 4B. In addition, the memory device 1200 may include a stacked structure, openings passing through the stacked structure, semiconductor patterns formed over inner walls of the openings, and insulating patterns formed over the semiconductor patterns to fill the opening, each sealing an upper portion of the opening and including at least one air gap. Since the memory device 1200 is configured and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may serve as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data which is read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data externally transferred through the host interface 1130, or temporarily store data transferred from the memory device 1200 through the memory interface 1150. The controller 1100 may further include ROM storing code data to interface with the host.

Since the memory system 1000 according to the embodiment includes the memory device 1200 having improved structural stability and simplified manufacturing processes, characteristics of the memory system 1000 may also be improved.

Figure 6:
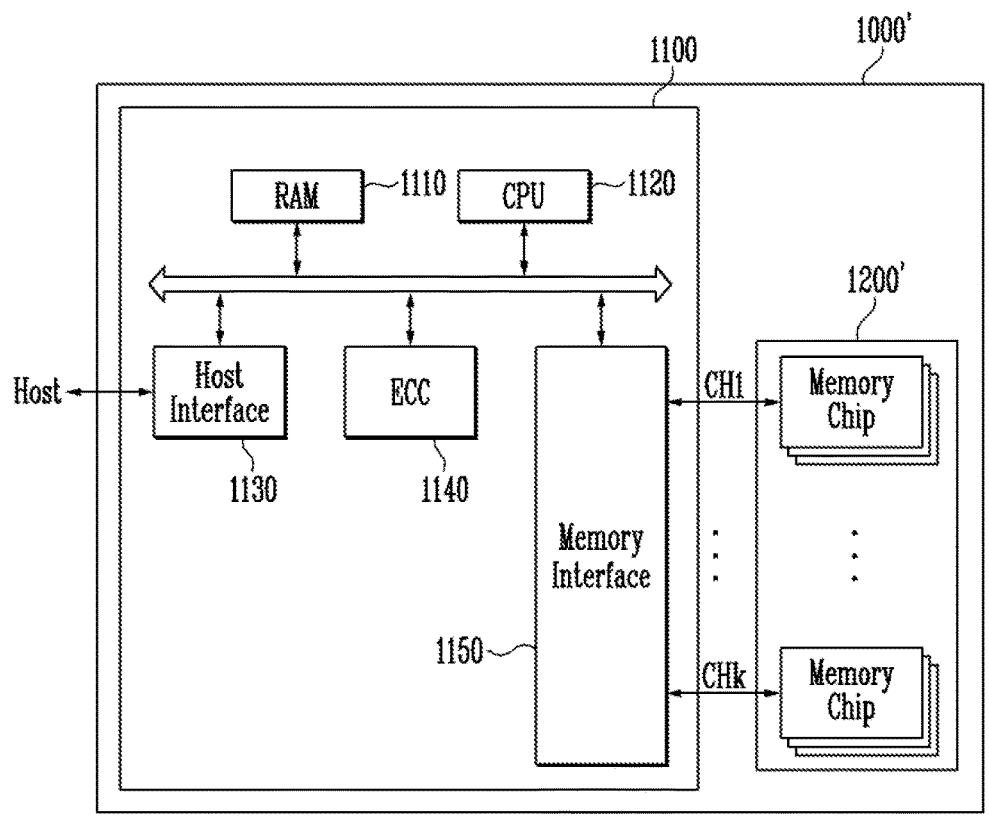

FIG. 6 is a block diagram illustrating a memory system according to an embodiment. Hereinafter, descriptions of components already mentioned above are omitted.

As illustrated in FIG. 6, the memory system 1000' according to the embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may include the memory strings described above with reference to FIGS. 1A to 4B. In addition, the memory device 1200' may include a stacked structure, openings passing through the stacked structure, semiconductor patterns formed over inner walls of the openings, and insulating patterns formed over the semiconductor patterns to fill the opening, each sealing an upper portion of the opening and including at least one air gap. Since the memory device 1200' is configured and manufactured in the above-described manner, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k-th channels CH1 to CHk, respectively. In addition, memory chips, included in a single group, may be suitable for communicating with the controller 1100 through a common channel. The memory system 1000' may be modified so that a single memory chip may be coupled to a single channel.

As described above, according to the embodiment, since the memory system 1000' includes the memory device 1200' having improved structural stability and simplified manufacturing processes, characteristics of the memory system 1000' may also be improved. In addition, since the memory device 1200' is formed using a multi-chip package, data storage capacity and driving speed of the memory system 1000' may be further increased.

Figure 7:
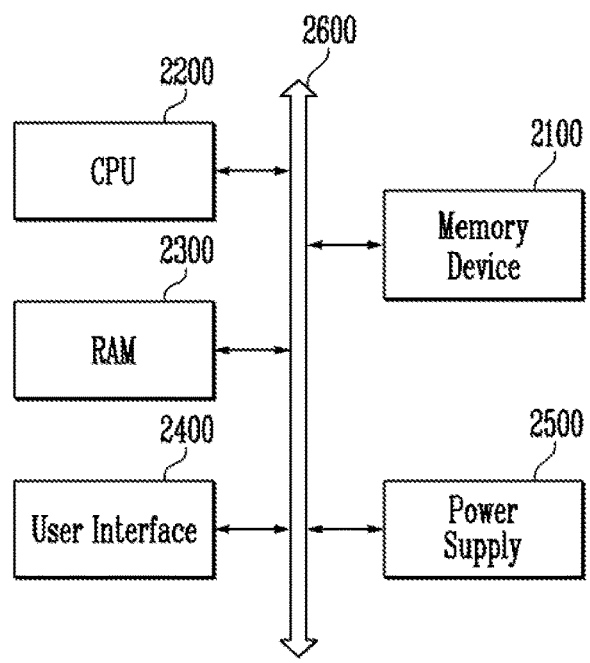
FIGS. 7 and 8 are block diagrams illustrating a memory system according to an embodiment.

FIG. 7 is a block diagram illustrating a computing system according to an embodiment. Hereinafter, descriptions of components already mentioned above are omitted.

As illustrated in FIG. 7, the computing system 2000 according to the embodiment may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or be directly coupled to the system bus 2600. When the memory device 2100 is directly coupled to the system bus 2600, the CPU 2200 and the RAM 2300 may serve as the controller.

The memory device 2100 may be a non-volatile memory. The memory device 2100 may be the memory string described above with reference to FIGS. 1A to 4B. The memory device 2100 may include a stacked structure, openings passing through the stacked structure, semiconductor patterns formed over inner walls of the openings, and insulating patterns formed over the semiconductor patterns to fill the opening, each sealing an upper portion of the opening and including at least one air gap. Since the memory device 2100 is configured and manufactured in the same manner as described above, a detailed description thereof will be omitted.

In addition, as described above with reference to FIG. 6, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to the embodiment includes the memory device 2100 having improved structural stability and simplified manufacturing processes, characteristics of the computing system 2000 may be improved.

Figure 8:
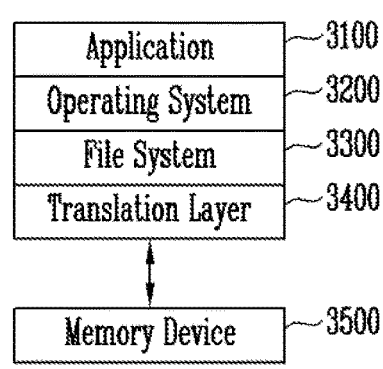

FIG. 8 is a block diagram illustrating a computing system according to an embodiment.

As illustrated in FIG. 8, a computing system 3000 according to the embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 8 illustrates the operating system 3200, the application 3100, and the file system 3300 in separate blocks. However, the application 3100 and the file system 3300 may be included in the operating system 3200.

The translation layer 3400 may translate an address suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device described above and shown in FIGS. 1A to 4B. The memory device 3500 may include a stacked structure, openings passing through the stacked structure, semiconductor patterns formed over inner walls of the openings, and insulating patterns formed over the semiconductor patterns to fill the opening, each sealing an upper portion of the opening and including at least one air gap. Since the memory device 3500 is configured and manufactured the same as the memory devices 1200, 1200' or 2100, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to the embodiment includes the memory device 3500 having improved structural stability and simplified manufacturing processes, characteristics of the computing system 2000 may be improved.

In accordance with the present invention, a semiconductor device may include insulating patterns formed on semiconductor patterns to seal upper portions of openings. Since the semiconductor patterns are not exposed, agglomeration of the semiconductor patterns may be prevented. Thus, curing or heat treatment to avoid agglomeration of the semiconductor patterns may be skipped. In addition, since the upper portions of the openings are completely sealed by the insulating patterns, conductive patterns may be formed to a uniform depth.

What is claimed is:

1. A method of fabricating a semiconductor device, the method comprising:
   forming a stacked structure including first material layers and second material layers that are alternately stacked on each other;
   forming openings by passing through the stacked structure;
   forming semiconductor patterns in the openings; and
   forming insulating patterns in the semiconductor patterns to fill the openings, wherein each of the insulating patterns seals an upper portion of each of the opening and includes at least one air gap,
   wherein a top of an uppermost air gap among the at least one air gap is located at a lower level than a bottom of an uppermost first material layer among the first material layers and is located at a higher level than a top of a lowermost first material layer among the first material layers as viewed in a cross section.

2. The method of claim 1, wherein each of the openings has the upper portion and a lower portion whose widths are substantially equal to each other.

3. The method of claim 1, wherein the forming of the insulating patterns comprises:
forming liner layers in the semiconductor patterns; and
forming gap-fill insulating layers in the liner layers to fill the openings and seal upper portions of the openings.

4. The method of claim 3, wherein the forming of the liner layers is performed by a deposition method and has better step coverage than the forming of the gap-fill insulating layers.

5. The method of claim 3, wherein the forming of the gap-fill insulating layers is performed at a higher deposition rate than the forming of the liner layers.

6. The method of claim 3, wherein the forming of the liner layers is performed by an Atomic Layer Deposition (ALD) method or a Chemical Vapor Deposition (CVD) method.

7. The method of claim 3, wherein the forming of the gap-fill insulating layers is performed by an Atomic Layer Deposition (ALD) method, a Chemical Vapor Deposition (CVD) method, or a High Aspect Ratio Process (HARP) method.

8. The method of claim 1, wherein the forming of the insulating patterns comprises:
forming liner layers in the semiconductor patterns to fill the openings, wherein the liner layers seal upper portions of the openings, and each of the liner layers includes the air gap.

9. The method of claim 1, further comprising:
partially etching the insulating patterns to form a re-opened area of the openings; and
forming conductive plugs in the re-opened area of the openings.

10. The method of claim 9, wherein the conductive plugs have a uniform height.

11. The method of claim 1, further comprising:
replacing the first material layers by conductive layers.

12. The method of claim 11, wherein the conductive layers include a plurality of control gate electrodes and at least one selection gate electrode over the plurality of control gate electrodes.

13. A method of fabricating a semiconductor device, the method comprising:
forming a stacked structure;
forming openings by passing through the stacked structure;
forming semiconductor patterns in the openings; and
forming insulating patterns in the semiconductor patterns to fill the openings, wherein each of the insulating patterns seals an upper portion of an opening and includes at least one air gap, and
wherein the stacked structure includes conductive layers and insulating layers that are alternately stacked, and a top of an uppermost air gap among the at least one air gap is located at a lower level than a bottom of an uppermost conductive layer among the conductive layers and is located at a higher level than a top of a lowermost conductive layer among the conductive layers as viewed in a cross section.

14. The method of claim 13, wherein the uppermost air gap does not overlap the uppermost conductive layer as viewed in a cross section.

15. The method of claim 13, wherein the insulating patterns include:
liner layers formed in respective channel patterns; and
gap-fill insulating layers formed in the liner layers to seal upper portions of the openings.

16. A method of fabricating a semiconductor device, the method comprising:
forming a stacked structure;
forming openings by passing through the stacked structure;
forming semiconductor patterns in the openings; and
forming insulating patterns in the semiconductor patterns to fill the openings, wherein each of the insulating patterns seals an upper portion of an opening and includes at least one air gap,
wherein the stacked structure includes at least one lower selection gate electrode, a plurality of control gate electrodes over the at least one lower selection gate electrode and at least one upper selection gate electrode over the plurality of control gate electrodes, and
wherein a top of an uppermost air gap among the at least one air gap is located at a lower level than the at least one upper selection gate electrode as viewed in a cross section.

* * * * *